(12) United States Patent
Ljusev et al.

(10) Patent No.: US 7,683,707 B2
(45) Date of Patent: Mar. 23, 2010

(54) SELF-OSCILLATING MODULATOR

(75) Inventors: Petar Ljusev, Copenhagen S (DK);
Michael A. E. Andersen, Lyngby (DK)

(73) Assignee: Danmarks Tekniske Universitet,
Kongens Lyngby (DK)

( * ) Notice: Subject to any disclaimer, the term of this patent is extended or adjusted under 35 U.S.C. 154(b) by 182 days.

(21) Appl. No.: 11/991,397

(22) PCT Filed: Sep. 1, 2006

(86) PCT No.: PCT/DK2006/000472

§ 371 (c)(1),
(2), (4) Date: Feb. 29, 2008

(87) PCT Pub. No.: WO2007/025548

PCT Pub. Date: Mar. 8, 2007

(65) Prior Publication Data

US 2009/0268486 A1 Oct. 29, 2009

(30) Foreign Application Priority Data

Mar. 1, 2006 (DK) ............................. 2006 00293

(51) Int. Cl.
*H03F 3/38* (2006.01)
(52) U.S. Cl. ............... 330/10; 330/251; 330/207 A; 330/291
(58) Field of Classification Search ............... 330/10, 330/251, 207 A, 291
See application file for complete search history.

(56) References Cited

U.S. PATENT DOCUMENTS

| 3,886,455 | A | * | 5/1975 | Jonckheere | 455/113 |
| 4,992,751 | A | | 2/1991 | Attwood et al. | |
| 6,518,838 | B1 | * | 2/2003 | Risbo | 330/10 |
| 6,552,606 | B1 | | 4/2003 | Veltman et al. | |
| 7,002,406 | B2 | * | 2/2006 | Risbo et al. | 330/10 |
| 7,554,474 | B2 | * | 6/2009 | Le Guillou | 341/143 |

FOREIGN PATENT DOCUMENTS

| DE | 19838765 | 5/2000 |
| EP | 1376858 | 1/2004 |
| WO | WO9819391 | 5/1999 |
| WO | WO0202357 | 3/2002 |
| WO | WO2004100356 | 11/2004 |

* cited by examiner

*Primary Examiner*—Patricia Nguyen
(74) *Attorney, Agent, or Firm*—Cooper & Dunham LLP

(57) ABSTRACT

A self-oscillating modulator operates at a two-level output. The modulator comprises an alternating output stage (13), an optional output filter (14), a feedback (16) including a function block with a transfer function (MFB), a forward block (12) having a transfer function (MFW) and is provided with means (17) for calculating the difference between the signal originating from said function block and a reference signal. The output voltage of the modulator either from the alternating output stage (13) and/or the output filter (14) is fed back through the function block, and a multiplication element (11) is placed together with the forward block (12) before the alternating output stage (13).

17 Claims, 11 Drawing Sheets

SELF-OSCILLATING MODULATOR

TECHNICAL FIELD

The present invention relates to a self-oscillating modulator operating at a two-level output, said modulator comprising an alternating output stage, an optional output filter, a feedback including a function block with a transfer function, a forward block having a transfer function and being provided with means for calculating the difference between the signal originating from said function block and a reference signal, where an output voltage of the modulator either from the alternating output stage and/or the output filter is fed back through the function block.

BACKGROUND ART

The switching-mode power conversion technology has over the years radically changed the appearance of commercial products, making them far smaller than a few decades ago and leaving the designers with possibilities to experiment with their look and feel without being limited by technology barriers. These benefits are a direct result of the improved efficiency of the power supplies and power amplifiers that use a switching approach instead of a linear one. As a side effect, the amount of heat-sinking material needed is reduced by at least an order of magnitude, which improves the level of integration between the various components, so that the overall board space, weight and volume are significantly reduced and power density is improved. The aforementioned advantages are probably most clearly seen in the switching-mode Class D audio power amplifiers, where the new efficient power conversion principle has opened the doors to some new and challenging application areas, from the smallest low-end portable devices with extended battery life to the large high-end audio installations for stage performances with tremendously reduced dimensions.

The achievements in the field of switching-mode audio power amplification in the last few years, described in terms of even higher output power levels and improved audio performance, are drawing this approach on the technology map as one of the most significant breakthroughs that is eventually going to replace linear electronic in most of the power processing applications. However, this does not mean that the present Class D audio power amplifiers are the only possible solution that fits all application, and much research is done to take the most advantage from the very high conversion efficiency of the switching-mode approach while still keeping the complexity and component count to a minimum.

These unique challenges, posed predominantly by the audio and video product manufacturers wanting to penetrate the low-end market by cutting production costs and introducing cheap products of satisfactory quality, can be answered by further and closer integration of the constitutive parts of the audio power amplifier, i.e. the switching-mode power supply and the Class D amplifier, which until now usually have been viewed as separate parts without many touching points.

Several initiatives to improve power conversion system using a control approach that utilises the self-oscillating principle have been proposed.

DE 198 38 765 discloses a power amplifier employing a hysteresis control for generating pulse width-demodulated voltages. The difference between the input voltage and the output voltage is integrated in this power amplifier, said difference being stepped down by a factor corresponding to the ratio of the maximum level of the input voltage to the maximum level of the output voltage. The difference between the scaled output signal and the input signal corresponds to the instantaneous amplitude error of the output signal with the result that the integration corresponds to the accumulated error on the output. The output signal of the integrator is triangular, and when the power amplifier is idle running, the slope of said triangle is of the same value for both the positive and the negative flanks. When the power amplifier is to be set, i.e. loaded, these flanks change in such a manner that the positive flank discloses a slope differing from the slope of the negative flank. However, the curve shape remains triangular with straight flanks. As the power amplifier is increasingly loaded, the switch-frequency decreases as well. As a result, for instance the input signal to the power amplifier is sinusoidal, and then the switch-frequency is at maximum at the zero-pass for the sine curve and significantly lower at the maximum and the minimum value, respectively, of said sine curve. When the power amplifier is loaded to its maximum, i.e. when the maximum value of the output voltage is almost identical with the internal DC-voltage of the power amplifier, then the switch-frequency becomes very low, almost zero. The triangular signal from the integrator is transferred to a comparator, typically a Schmitt-trigger, which converts the triangular signal into square pulses of a varying pulse width. These square pulses are the switching on signals and the switching off signals, respectively, for the transistors in the power amplifier. These switching on pulses are transferred to the output stage of the power amplifier, viz. to the transistors in the output, and therefore these pulses are upscaled by the relation between said pulse voltages and the internal DC-voltage of the power amplifier. The resulting voltage includes square pulses and is typically of a higher amplitude than the signal voltage. The square voltage is then transmitted to the output filter of the power amplifier, said output filter typically being a second order filter which is often referred to as a reconstruction filter. The voltage applying after the filter is the output voltage of the power amplifier. The voltage returned to the integrator is the voltage applying before the output filter. A modulator of this type is often referred to as an Astable Integrating Modulator or an AIM. Such a modulator is encumbered with the problem that the distortions of the output filter have not been taken into account. In addition, the operational amplifier used to construct the integrator has to be of high quality.

WO 02/25357 discloses a controlled oscillation modulator, also called a COM. The COM ensures that the open-loop-phase characteristics involve a phase shift of exactly 180° at the frequency where the open-loop-amplification is 0 dB. The latter is rendered possible by the feedback voltage from the output stage of the power amplifier being forwarded through function blocks causing a phase shift of 180° and/or through function blocks with time delays. The desired phase shift of 180° is obtained by including said phase shift in the function blocks, such as in form of a cascade coupling of poles, and/or by choosing a suitable time delay. When the feedback loop is subsequently closed, the modulator oscillates at the frequency, where the amplification is 0 dB. When the input signal to the power amplifier is 0, the resulting signal is a substantially pure sine. When the input signal differs from 0, the oscillation is superimposed by the input signal. A comparator is subsequently used for generating the switching pulses of the output stage. An increasing loading of the amplifier has the effect that the pure sine resulting from the phase shift of 180° is altered into being something between the pure sine and the triangular voltage known from AIM. The linearity of a modulator depends on variations in the inclination of this signal. As this signal is not a pure triangular curve unlike AIM, but instead something between a sine curve and a triangular curve, the modulator according to the COM principle is nonlinear, and the modulation per se distorts the output signal.

WO 98/19391 describes a way of improving a class D power amplifier. The amplifier includes an internal modulator generating the well-known pulse-width-demodulated output signal. This signal is transmitted to an output filter, and the resulting filtered signal is the output voltage of the power amplifier. In order to compensate for the distortions of the filter, additional feedback loops have been included, and the characteristics of these feedback loops can compensate for the distortions of said output filter. The described system includes several cascade-coupled feedback loops for compensating the distortions. The system shows an improved procedure structure with respect to power amplifiers without such feedbacks, but the system is per se very complex and requires much design work in order to achieve the desired effect. A system of this type is often referred to as being Multivariable Enhanced Cascade Controlled or MECC.

WO 04/100356 discloses a switch-mode modulator operating at a two-level voltage and including an alternating output stage, an optional output filter and a feedback including a function block with a transfer function. The modulator furthermore includes a forward block provided with means for calculating the difference between the signal originating from the function block and a reference signal as well as with a transfer function. The output of the forward block is the input of a Schmitt-trigger, which generates switch on signals for changing the output stage. The output voltage of the modulator applying either after the optional output filter or the output stage is fed back through the function block so as to generate the signal fed back. The transfer function of the function block and of the forward block is chosen both in response to the transfer function of the output filter and in response to the desired total open-loop-transfer function of the modulator.

U.S. Pat. No. 4,992,751 discloses an audio amplifier with phase modulated pulse width modulation, wherein clamping means are used for removing overshoot spikes in the pulse width modulated output signal.

U.S. Pat. No. 6,552,606 B1 discloses a modulator in which the feedback is the current measured through the capacitor of the output filter. The power amplifier is thus a voltage controlled current generator.

All the above mentioned modulators are supplied by a DC-link converter.

HF-link converters represent an interesting alternative to the conventional isolated power converters with DC-link as found in a wide range of products from audio power amplifiers, converters for renewable energy sources, uninterruptible power supplies (UPSs) to general isolated power converters. They feature compact design achieved through the removal of the DC-link and the bulky filters associated with it, leading to a high level of integration, higher efficiency, less volume and board space, low component count and subsequently low cost.

However, the continuously changing polarity of the HF-link voltage causes the prior art self-oscillating modulators for DC-link converters to become unstable and therefore unusable in HF-link converters.

The object of the invention is to provide a new and improved self-oscillating modulator, which is especially applicable for HF-link converters.

DISCLOSURE OF INVENTION

This is according to the invention obtained by the self-oscillating modulator having a multiplication element placed together with the forward block before the alternating output stage. The multiplication element can thus be utilised to change the polarity of signal sent to the alternating output stage, thereby compensating for the polarity of the power converter, in which the modulator is used.

In a preferred embodiment according to the invention, the alternating output stage is supplied with an AC-voltage from an AC-link converter, said AC link converter preferably being an HF-link converter. The AC-voltage can be of any shape, such as square, sinus, triangular or saw-toothed shaped, and can have any duty cycle, as long as the voltage of the HF-link has zero mean value in order not to saturate the transformer.

In a preferred embodiment, the forward block includes a comparator. In yet another embodiment, the forward block includes a hysteris block, such as a Schmitt trigger. Hereby, simple means for comparing the signal fed back with the reference signal are provided.

In another embodiment of the self-oscillating modulator, the means for comparing the signal fed back with the reference signal comprises two identical comparator sections, which have inverted inputs. Hereby, a particular simple manner to produce two comparator outputs with different signs is obtained. The comparators can be hysteresis controlled.

In a preferred embodiment according to the invention, the multiplication element works by switching between the two identical comparator sections with inverted inputs, said switching being controlled by the sign of the AC-voltage from the AC-link converter. Thereby, it is achieved that the sign of the signal from the comparator section reflects the polarity of the AC-voltage, thus compensating for the inversion of the signal in the alternating output stage. The switching can be controlled in any way, for instance by use of a logic circuit or a transistor.

In yet another embodiment, the transfer functions of the forward block, the transfer function of the function block of the feedback, as well as the transfer function of the optional output filter depend on the desired open-loop transfer function. Thereby, for instance the transfer function of the forward block can be chosen to compensate the error signal (difference between the signal fed back and the reference signal) in an optimised way dependent of the specific switch-mode power amplifier, and the transfer function of the output filter can be optimised to reconstruct the signal. The transfer function of the function block can in turn be determined from the desired open-loop transfer function.

In a particularly preferred embodiment according to the invention, the AC-voltage supplied to the alternating output stage has a rectangular form with a 50% duty cycle. Thereby the AC-link or HF-link converter is particularly applicable to supply multiple output stages, for example in a multi-channel audio system or a multi-phase power system.

Preferably, the alternating output stage is a switching amplifier with bidirectional switches.

In a preferred embodiment of the self-oscillating modulator, the AC-link converter comprises an input stage and an output stage, and the AC-link converter can be driven either in a normal operation mode with a variable switching frequency of the output stage or a locked operation mode, where the switching frequency of the output stage is locked to the switching frequency of the input stage. This means that the modulator can be both used in a mode similar to the modulators with DC-link and a mode, which is particularly stable.

According to a preferred embodiment of the self-oscillating modulator, the normal operation mode will occur if the modulation index of a reference voltage signal at the input of the modulator is lower than a modulation index limit, and locked operation mode will occur if the modulation index exceeds the modulation index limit. This yields a particularly simple way to switch between the two operation modes, for instance by regulating the modulation index of a transformer in the AC-link converter.

In a preferred embodiment of the invention, an idling switching frequency of the modulator is lower than two times the HF-link frequency. In this way the modulation index limit becomes zero, and it is ensured that the modulator always operates in the locked operation mode.

In a preferred embodiment according to the invention, one or more of the zero points or poles of the function block and of the forward block are coinciding or approximately coinciding with the pole or zero points of the optional output filter.

In yet another embodiment according to the invention, the modulator further includes one or more additional output filters, one or more additional feedbacks with transfer functions coupled either after the output stage, after the output filter or after one or more of the additional output filters, as well as one or more forward blocks, which include both means for calculating the difference between one of the signals fed back from the additional function blocks and a reference signal, as well as a transfer function. Thereby even further loops to stabilise the modulator and compensate for error signals have been provided.

Preferably, the transfer function of the function block, the transfer function of the forward block, the additional output filters, the transfer functions of the additional function blocks and the transfer function of the additional forward blocks together are generating the desired total transfer function.

In an embodiment according to the invention, the modulator includes only one additional function block used as feedback for one or more additional forward blocks. In yet another embodiment, the modulator uses the output signal of the function block for feeding back to one or more additional forward blocks.

In a particularly preferred embodiment of the self-oscillating modulator, the desired total transfer function is similar to a first order low-pass-characteristic or integrator characteristic.

BRIEF DESCRIPTION OF THE DRAWINGS

The invention is now to be described in greater detail with reference to the drawings, in which.

BEST MODES FOR CARRYING OUT THE INVENTION

Figure 1:
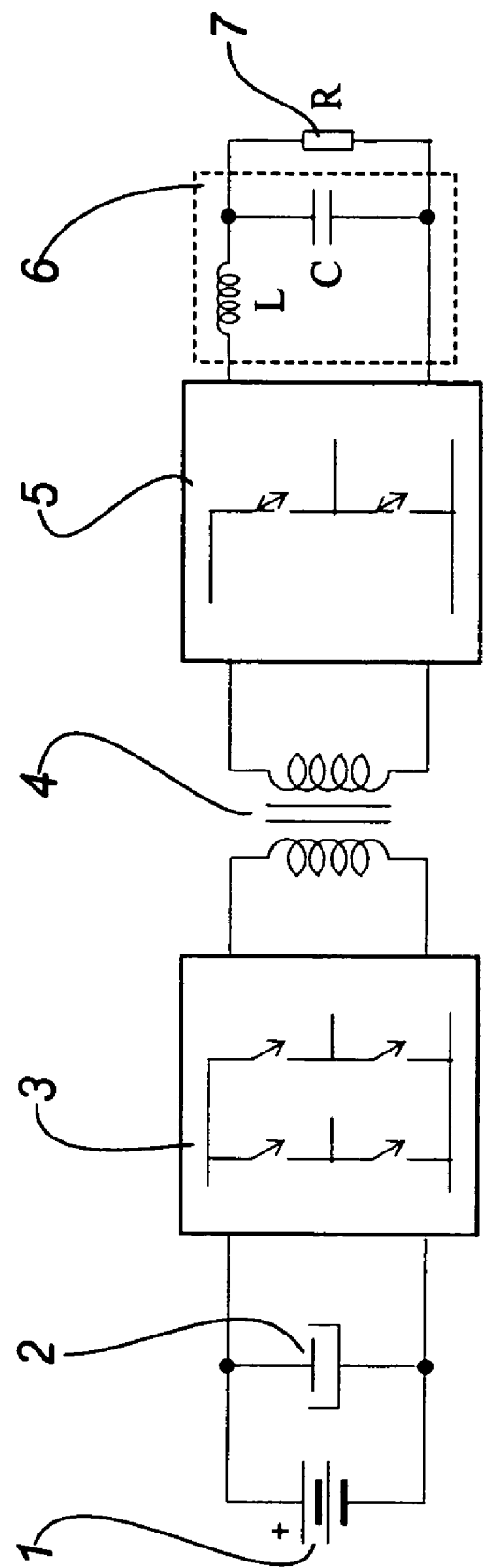
FIG. 1 shows a block scheme of a HF-link converter, FIG. 2 an embodiment of a prior art self-oscillating modulator, FIG. 3 an embodiment of a self-oscillating modulator according to the invention, FIG. 4 another embodiment of a self-oscillating modulator according to the invention, FIG. 5 yet another embodiment of a self-oscillating modulator according to the invention, FIG. 6 an implementation of a multiplication element according to the invention, FIGS. 7-9 various system characteristics as a function of the modulation index M, FIG. 10 various signals in the modulator during normal modulator operation, FIG. 11 various signals in the modulator during locked modulator operation, and FIG. 12 an asymptotic stability of the locked modulator operation.

A block scheme of a HF-link converter is shown in FIG. 1. The HF-link converter consists of a DC voltage source 1, such as a rectified AC-mains voltage, a fuel cell, a solar cell (photovoltaic), or a battery, decoupled with a capacitor 2. The power from the voltage source 1 is input to a HF-operated inverter 3 driving a transformer 4. On the secondary side of the transformer 4, the AC transformer voltage is directly used in an output stage, i.e. a bidirectional bridge 5 supplying power to an output filter 6, such as a second order low-pass filter with passive components LC, and a load 7, such as a loudspeaker.

In a special implementation of the HF-link converter, the converter uses a non-modulated transformer voltage, where the HF-inverter 3 on the primary side is free-running and creates a symmetrical rectangular voltage with a 50% duty cycle. That is, there is no modulation of the transformer voltage. This extends the capability of the HF-link converter, since the same input stage and transformer can be used to supply power to multiple output stages, for instance in a multi-channel audio system or a multi-phase power system. However, other shapes for the AC-voltage, such as sinus signals or triangular signals, as well as other duty cycles can be used as well.

Compared to a conventional Class D power amplifier, the main difference is the replacement of the switching-mode power amplifier DC-bus with the HF-link. The isolation transformer 4 is used as a connection point between the simplified power supply and the audio power amplifier, now comprising bidirectional switches 5, which are capable of blocking both voltage polarities and conducting current in both direction. In this way, the whole power conversion chain is shrunk, resulting in higher efficiency. At the same time, the bulky low-pass filter with a bulky capacitor usually found in conventional Class D power amplifiers can be removed together with output rectifiers, thus allowing bidirectional output flow through the isolation barrier down to the energy storage capacitor 2. Therefore, power supply pumping problems are non-existent with the new single conversion stage amplifier (SICAM).

Figure 2:
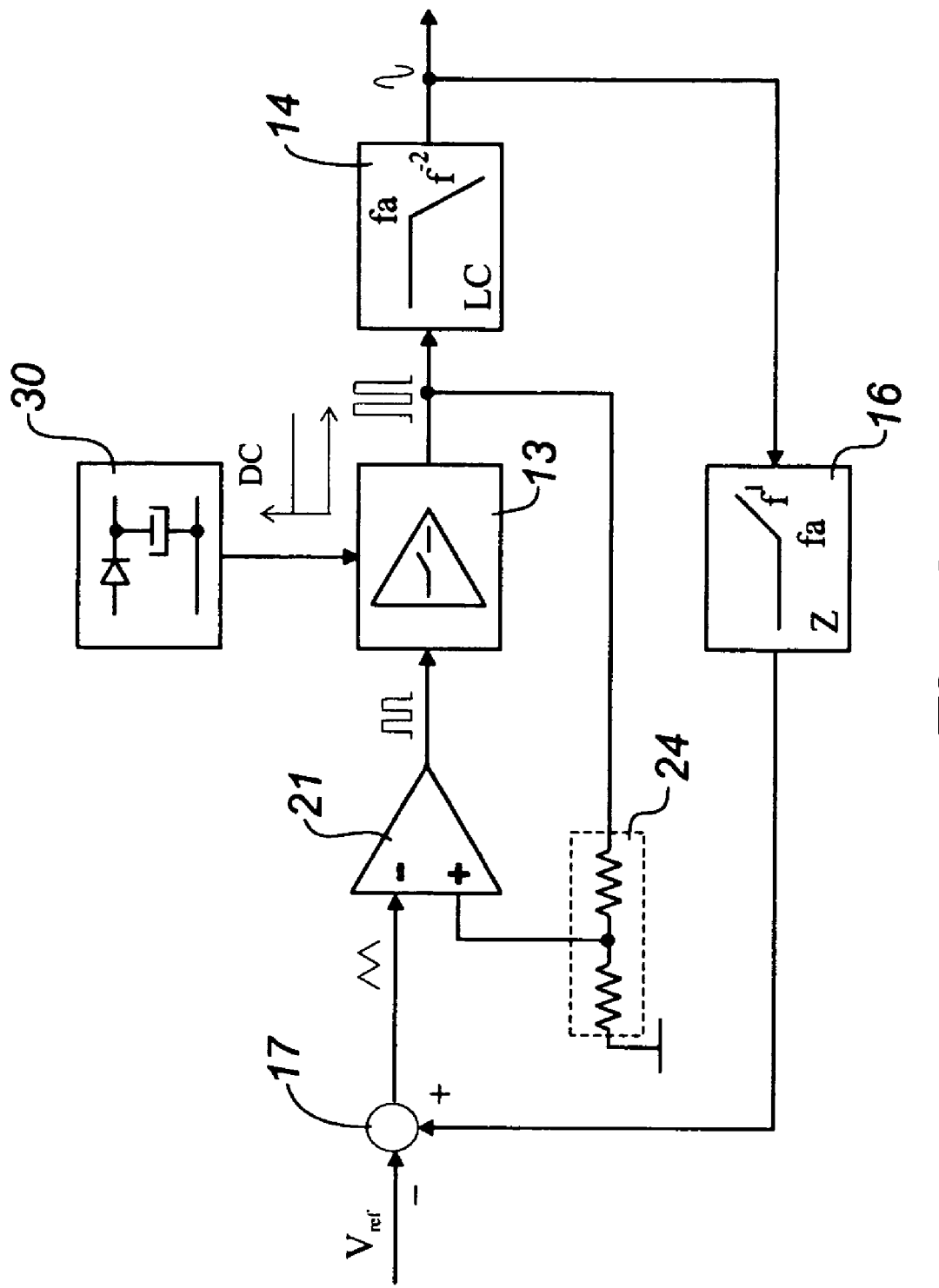

FIG. 2 shows one embodiment of a prior art global loop integrating modulator (GLIM), see also WO 04/100356. The switching amplifier 13 has a DC-voltage as input, which is subsequently being inverted in the switching amplifier 13, said switching amplifier 13 being supplied by a DC-signal from the DC-link 30.

This power amplifier employs a switch on signal for the switching amplifier 13, said switch on signal generating a square voltage being transmitted to an optional output filter 14, which reconstructs the desired output signal. The square voltage output from the switching amplifier 13 or the voltage after the optional filter 14 is fed to a block 16 including the transfer function MFB for the feedback of the modulator. The difference between the reference signal $V_{ref}$ and the signal fed back, or equivalently the error signal, is being extracted at a summing junction 17, said error signal being fed to a hysteresis block or comparator 21. The comparator 21 compares the error signal with the output signal from the switching amplifier 13, said output being fed back to the comparator 21 through a voltage divider 24. As a result of structuring the switch-mode power amplifier according to this principle, it is allowed to take into account the distortions of the output filter 14 and the output filter per se.

In all self-oscillating modulators, the polarity of the bridge voltage, which is being applied across the output filter 6 and the load 7 is determined solely by the state of the comparator 21, i.e. the output from the hysteresis block, since the power supply voltage has constant polarity. In SICAMs, the bridge voltage essentially represents a product of the HF-link voltage and the state of the comparator. Changing the HF-link polarity causes immediate change in the bridge voltage and the hysteresis window polarity bound to it, which will surely bring the power stage into stall due to the ill-posed hysteresis limits. Consequently, the continuously changing polarity of the HF-link voltage causes the prior art self-oscillating modulators for DC-link converters to become unusable in HF-link converters.

Therefore, any change in the HF-link voltage polarity must be followed by a corresponding change in the direction of integration, which essentially means that the polarity of the feed forward and feedback signals entering the comparator 21 must be reversed.

Figure 3:
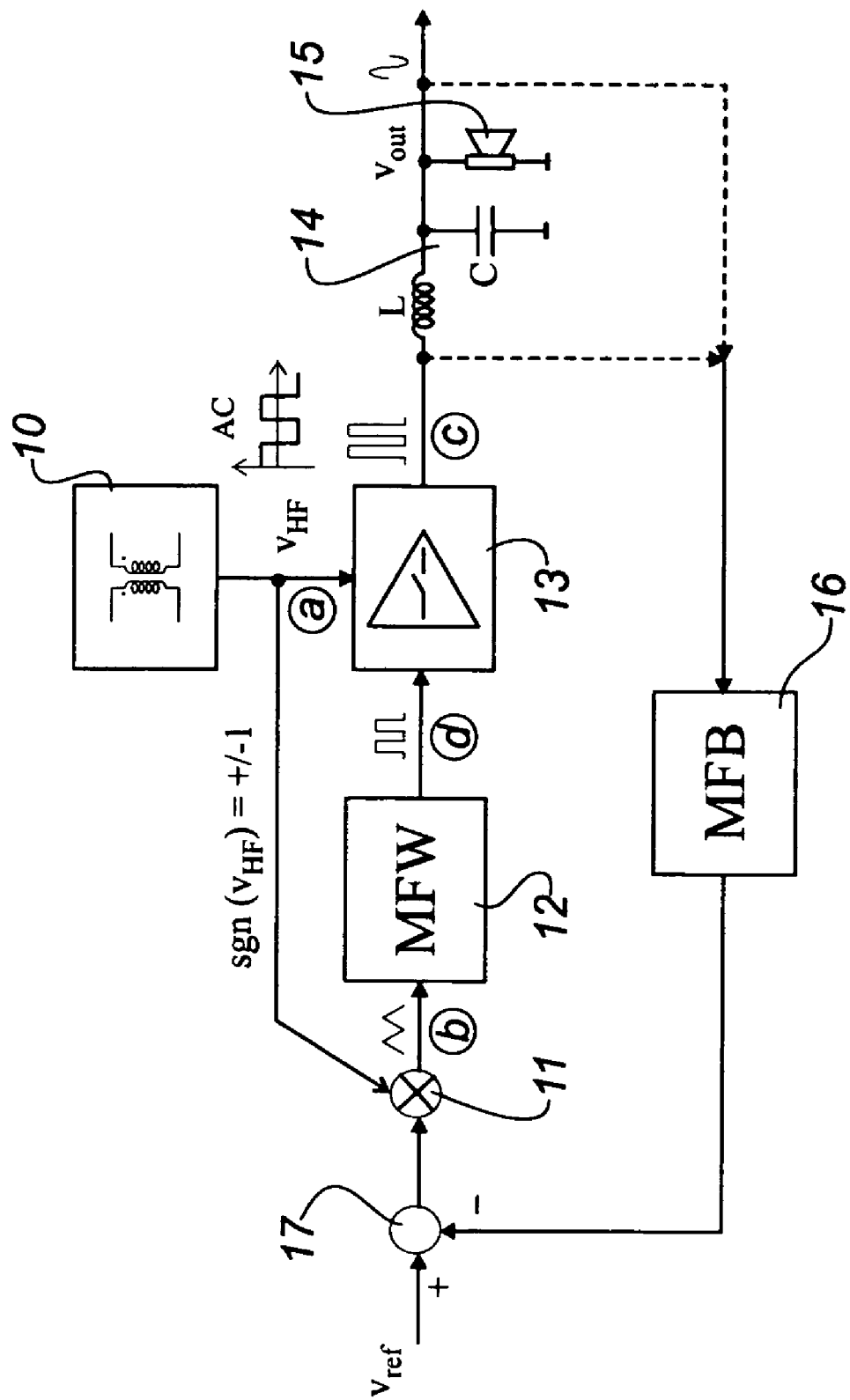

FIG. 3 shows a block diagram of a first embodiment of a self-oscillating modulator according to the invention, said modulator incorporating a multiplication element 11 in order to compensate for the changing polarity of the AC-voltage from a HF-link 10. The error signal from the summing junction 17 is fed to the multiplication element 11, which will either change the sign of the error signal or leave it unchanged dependent on the sign of the AC-voltage from the HF-link 10. The signal is then fed to the modulator feed forward block 12 with the transfer function MFW. The resulting signal is input to the switching amplifier 13, which is supplied with the AC-voltage from the HF-link 10. The output from the switching amplifier 13 can optionally be passed through an output filter 14 and to the load 15. The output filter 14 is here depicted as a second order low-pass filter with passive LC components, said low-pass filter reconstructing a sinus signal from the square voltage from the switching amplifier 13. However, the output filter can have any desired frequency compensating transfer function. The output from either the switching amplifier 13 or the output filter 14 is fed back through the modulator feedback block 16 having a transfer function MFB. The difference between the signal fed back and the reference signal $V_{ref}$ is thus being extracted at the summing junction 17.

The multiplication element 11 is in FIG. 3 placed before the feed forward block 12, but might as well have been placed after the feed forward block 12. The importance is that the multiplication element 11 is placed before the switching amplifier 13 in the forward loop, so that the polarity of the AC-voltage is compensated.

The transfer functions of the feed forward block 12, the feedback block 16 and the output filter 14 can have any desired frequency compensation. The filters can inter alia be high-pass filter, low-pass filters, band-pass filters, band-stop filters or unity filters based on the desired frequency compensation of the particular self-oscillating modulator and the open loop transfer function.

The addition of the multiplication element 11 to the modulator is thus applicable to all the GLIM embodiments shown in WO 04/100356, making these embodiments applicable for use in HF-link converters. The modification is also applicable to the embodiments of the controlled oscillation modulators (COMs) shown in WO 02/25357, the embodiments of the multivariable enhanced cascade controlled (MECC) switching power amplifier shown in WO 98/19391, the AIM-embodiments shown in DE 198 38 765 and the Mueta-embodiments shown in U.S. Pat. No. 6,552,606. The modification, however, is not limited to the aforementioned embodiments, but can be applied to any prior art self-oscillating modulator for DC-link converters, making them applicable for use in HF-link converters.

Figure 4:
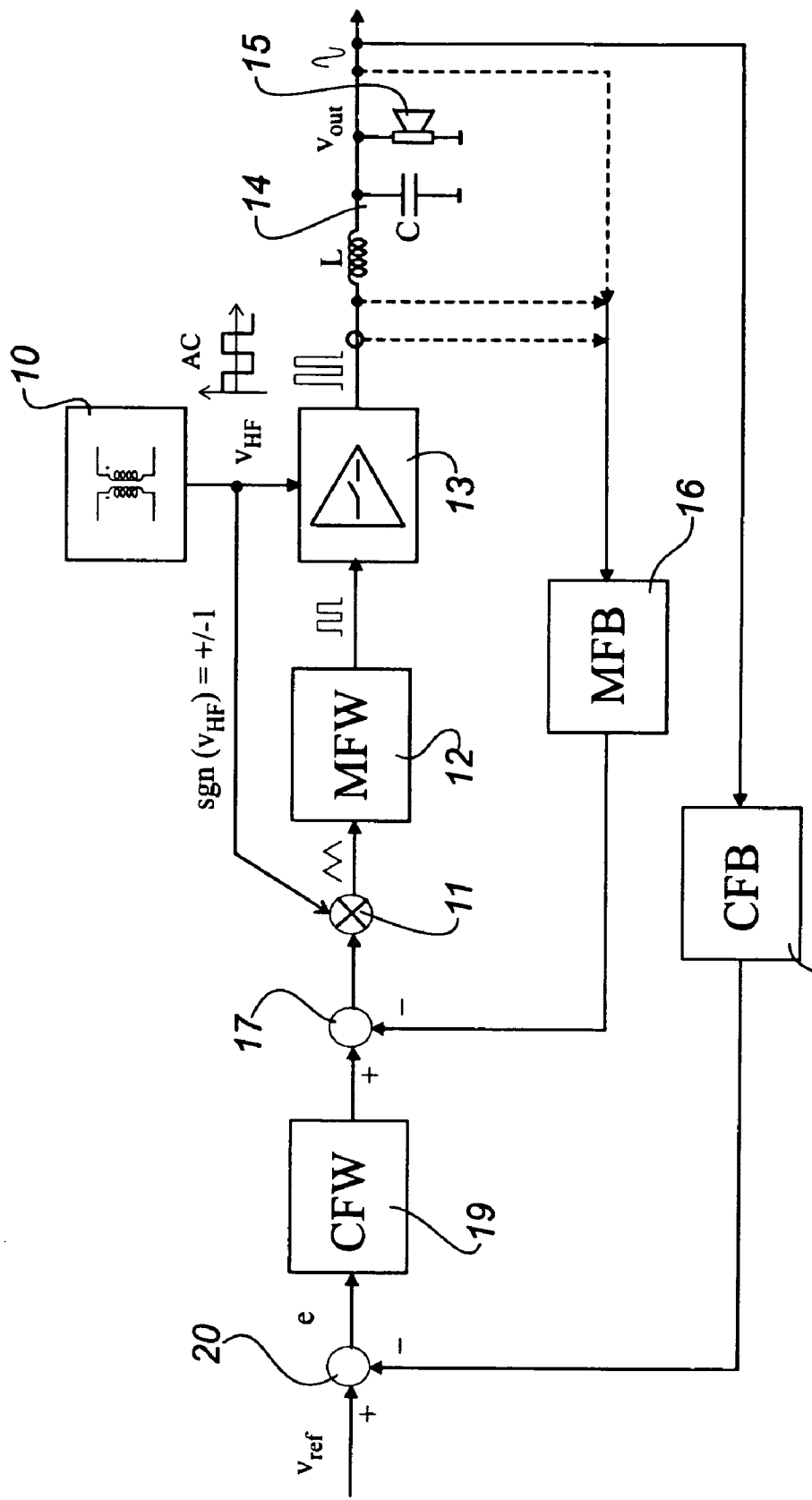

As with the GLIM, AIM, Mueta, COM and MECC embodiments, the self-oscillating modulator according to the invention can have one or more outer control loops, which improve the performance of the HF-link converter even further by introducing additional gain and optimising bandwidth within a control feed forward block 19 with a transfer function CFW and a control feedback block 18 with a transfer function CFB as shown in FIG. 4. In the depicted block diagram, the difference between the signal fed back through the control feedback block 18 and the reference signal $V_{ref}$ is extracted at an additional summing junction 20. Equivalently to the GLIM embodiments shown in WO 04/100356, the modulator can include any number of output filters, feedback blocks and feed forward blocks.

Figure 5:
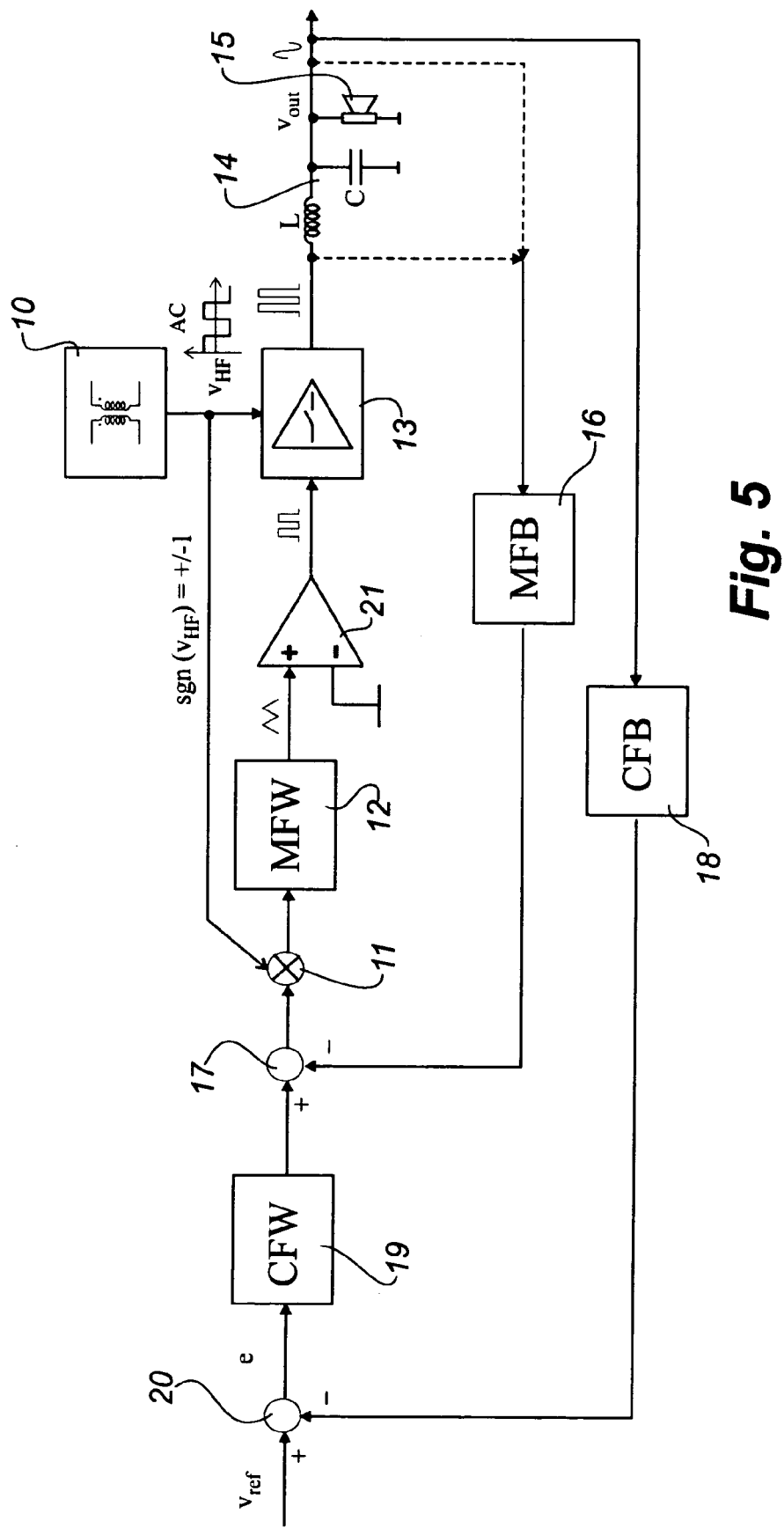

The forward loop of the modulator can as shown in FIG. 5 contain a comparator 21, preferably in form of a hysteresis block, said comparator 21 generating the switch on signal for the switching amplifier 13. The multiplication element 11 is once again depicted placed in front of the feed forward block 12 with the transfer function MFW, but it should be noted that the multiplication element can be placed between the feed forward block 12 and the comparator 21 or between the comparator 21 and the switching amplifier 13. The importance is that the multiplication element 11 is placed in front of the switching amplifier 13 in the forward loop of the self-oscillating modulator in order to compensate for the polarity of the AC-voltage from the HF-link 10.

Figure 6:
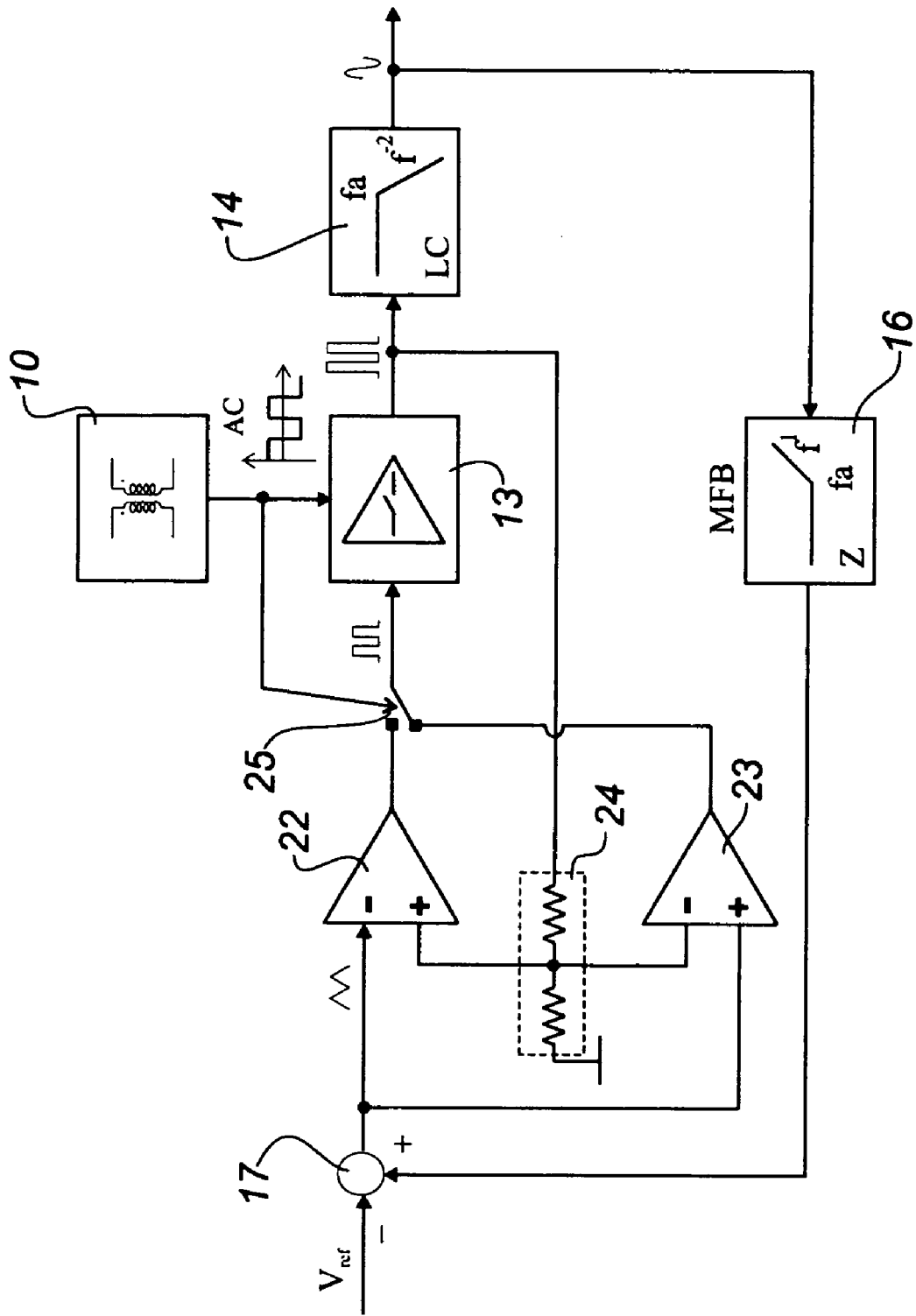

A particular implementation of the multiplication element 11 is shown in FIG. 6. The self-oscillating modulator contains two identical comparator sections 22, 23, which have inverted inputs, the input being the aforementioned error signal. The error signal is in the two comparator sections 22, 23 being compared to a signal fed back from the output of the switching amplifier 13 through a voltage divider 24. The switching between the two inverted outputs from the comparator sections 22, 23 are handled by a switch 25. The switch is being toggled by the sign of the AC-voltage from the HF-link 10, said switch 25 coupling the output from the first comparator 22 to the switching amplifier 13, if the AC-voltage is positive, and coupling the output from the second comparator 23 to the switching amplifier 13, if the AC-voltage is negative. This is in strong contrast to previous solutions for DC-link converters, where only a single modulator path is present. The toggling can for instance be handled by a logic circuit or a transistor.

One of the greatest challenges in the HF-link conversion system has up to now been the commutation of the load current between the switches in the output stage comprised of bidirectional switches 5 without any freewheeling path. The most common techniques for performing the switching in the output stage is use of safe-commutation techniques, which necessitate knowledge of either the transformer voltage polarity or load current direction, where accurate sensing of the latter is a rather involving task and often inadequate.

Other switching techniques include use of voltage clamps, where the outgoing and incoming switches are operated with intentional dead or blanking time between them, while the load voltage is being clamped to for instance a clamp capacitor voltage and the load current is diverted into it for this short period of time. The clamp can be implemented as either dissipative through for instance a power resistor, such as for instance suggested in U.S. Pat. No. 4,992,751, or as an active clamp, which preserves the clamped energy by returning it to the primary side or the load. The clamp itself offers higher level of safety and reliability against malfunctions of the bidirectional switches 5 in the output stage, but asks for additional power components and other additional losses.

One of the main difference between the self-oscillating modulators for HF-link converters and the conventional self-oscillating modulators as found in power converters with DC-link is the existence of two distinct modes of operation, viz. a normal operation mode and a locked operation mode. The normal operation mode is very similar to the operation of the power converter with DC-link in self-oscillating mode, where it introduces variable switching frequency of the output stage. In locked operation mode, the switching frequency of the output stage is locked to the fixed switching frequency of the input stage, resulting in constant switching frequency of the output stage with phase shifting dependent on the modulation index M of the reference voltage signal at the input of the modulator.

$M_{lim}$ denotes the modulation index limit, at which the frequency of the basic self-oscillating modulator, equal to the switching frequency $f_{s2}$ of the output stage, is two times the switching frequency $f_{s1}$ of the free-running input stage:

$$f_{s2}(M_{lim}) = 2f_{s1}$$

The modulation index limit $M_{lim}$ can vary in a wide range from 0 to 1, and if the modulation index M is below the modulation index limit $M_{lim}$, the modulator operates in the normal operation mode, and if the modulation index M is higher than or equal to the modulation index limit $M_{lim}$, the modulator operates in the locked operation mode. This means that the operation of the HF-link converter can be intentionally confined entirely into just one of the two modes.

Figure 10:
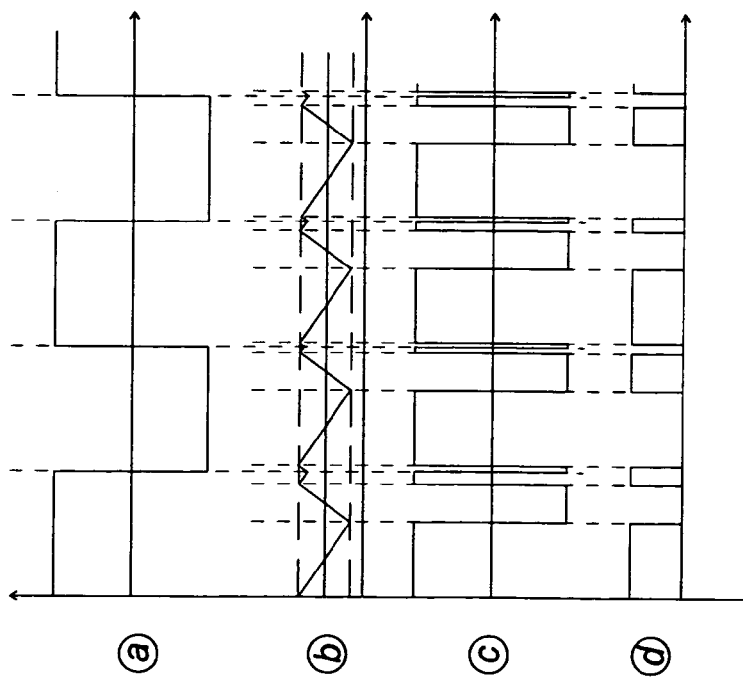

FIG. 10 illustrates an example of the different voltages, which occur in normal operation mode. (a) denotes the voltage of the HF-link (see also FIG. 3), (b) denotes the voltage with carrier hysteresis at the input to the forward block 12, (c) denotes the voltage at the output from the alternating stage 13, and (d) denotes the voltage at the input to the alternating stage. With low modulation indexes M, where the modulation index M is lower than the modulation index limit $M_{lim}$, the slopes of both the raising portion and the falling portion of the carrier (b) are steep and the output stage performs several switchings (c) within each period of the HF-link voltage $V_{HF}$. The nature of the operation makes it very difficult to determine the exact switching frequency of the output stage, since it depends not only on the feedback quantities, but also on the instants when the HF-link changes its polarity. However, it can be assumed with sufficient level of accuracy that the average switching frequency $f_{s2}$ of the output stage is equal to the switching frequency $f^*_{s2}$ of the basic self-oscillating modulator:

$$f_{s2}(M) = f^*_{s2}(M) = \frac{V_s}{4} \frac{1-M^2}{\tau_{int}V_h + t_d V_s}\bigg|_{M<M_{lim}}$$

where $V_s$ is equal to the numeric value of the HF-link voltage $v_{HF}$, $V_h$ is the width of the hysteresis window, $t_d$ is the time delay of the modulator loop and $\square_{int}$ is the integrator time constant, which for instance in the GLIM type modulator is equal to the output filter cut-off frequency. In all practical implementations, the hysteresis window $V_h$ is formed using the HF-link voltage:

$$V_h = k_h \cdot V_s,$$

where $k_h$ is an arbitrary, positive constant. The transfer function MFB of the modulator feedback block 16 features a transfer function with an attenuation $k_a$ equal to the gain of the SICAM amplifier, which causes the switching frequency $f_{s2}$ of the output stage to become independent of the supply voltage $V_s$ and significantly improving the power supply rejection ratio:

$$f_{s2}(M) = f^*_{s2}(M) = \frac{1}{4} \frac{1-M^2}{\tau_{int}k_h k_a + t_d}\bigg|_{M<M_{lim}}.$$

The idling switching frequency for M being equal to 0 is thus given by the following expression:

$$f_{s2,0} = \frac{1}{4} \frac{1}{\tau_{int}k_h k_a + t_d}.$$

Figure 11:
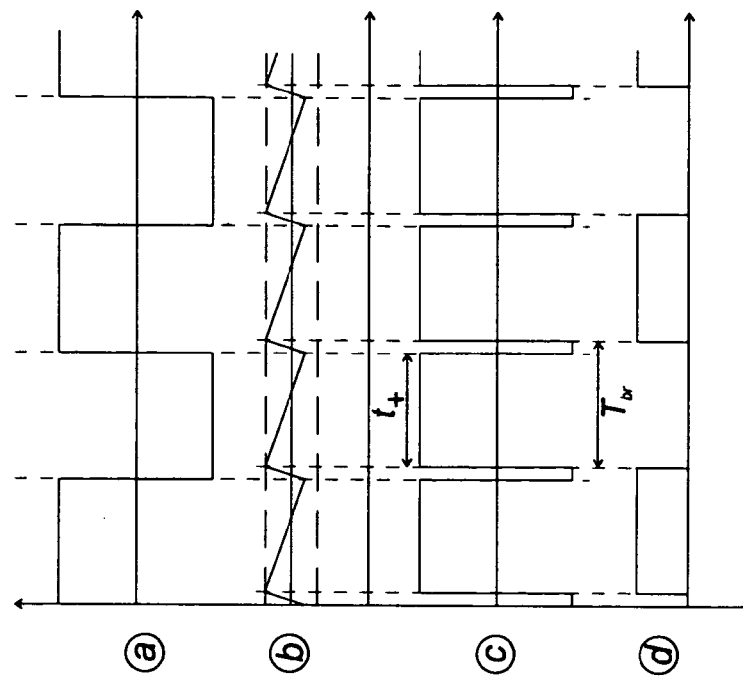

As mentioned, the real difference in the operation between the conventional self-oscillating modulator and the one for use in SICAMs is observed with the modulation indexes M being equal to or larger than the modulation index limit $M_{lim}$. As shown in FIG. 11, the bridge voltage (c) of the self-oscillating SICAMs with the modulation indexes M being equal to or larger than the modulation index limit $M_{lim}$ turns into a two-level phase-shifted pulse width modulation with constant frequency, where the frequency of the bridge voltage $f_{br}$ is two times the frequency $f_{s1}$ of the HF-link, while the switching frequency $f_{s2}$ of the output stage is exactly equal to the switching frequency of the input stage, i.e. equal to the switching frequency $f_{s1}$ of the HF-link.

The duty cycle D is defined as the ratio between the time interval $t_+$ with high voltage on the bridge output and the time period $T_{br}$ of the bridge output:

$$D = \frac{t_+}{T_{br}} = 2t_+ f_{s1}.$$

The output voltage $v_o$ of the SICAM is then calculated to be:

$$v_o = DV_s - (1-D)V_s = (2D-1)V_s.$$

The mutual dependency between the modulation index M and the duty cycle D is given by the following expression:

$$D = \frac{1 \pm M}{2},$$

where the "+" sign and the "−" sign are used for positive and negative reference voltages $v_{ref}$, respectively.

As implied, the frequency of the quantities associated with the secondary stage becomes locked to the primary side and the HF-link, since the slope of either the raising portion or the falling portion of the carrier has decreased as a result of the large modulation index M being higher or equal to $M_{lim}$. In this situation, the regular changes in the HF-link polarity interrupt the slower slope of one of the carrier portions before it encounters the other wall of the hysteresis block, causing a sort of carrier reset. The time interval between the phase-shifted waveforms created by the switching of the output stage and the subsequent switching of the HF-link is essentially equal to the time interval $t_+$ with positive bridge voltage and its dependence on the modulation index M is given by the following expression:

$$t_+ = DT_{br} = \frac{1 \pm M}{4f_{s1}}.$$

Figure 12:
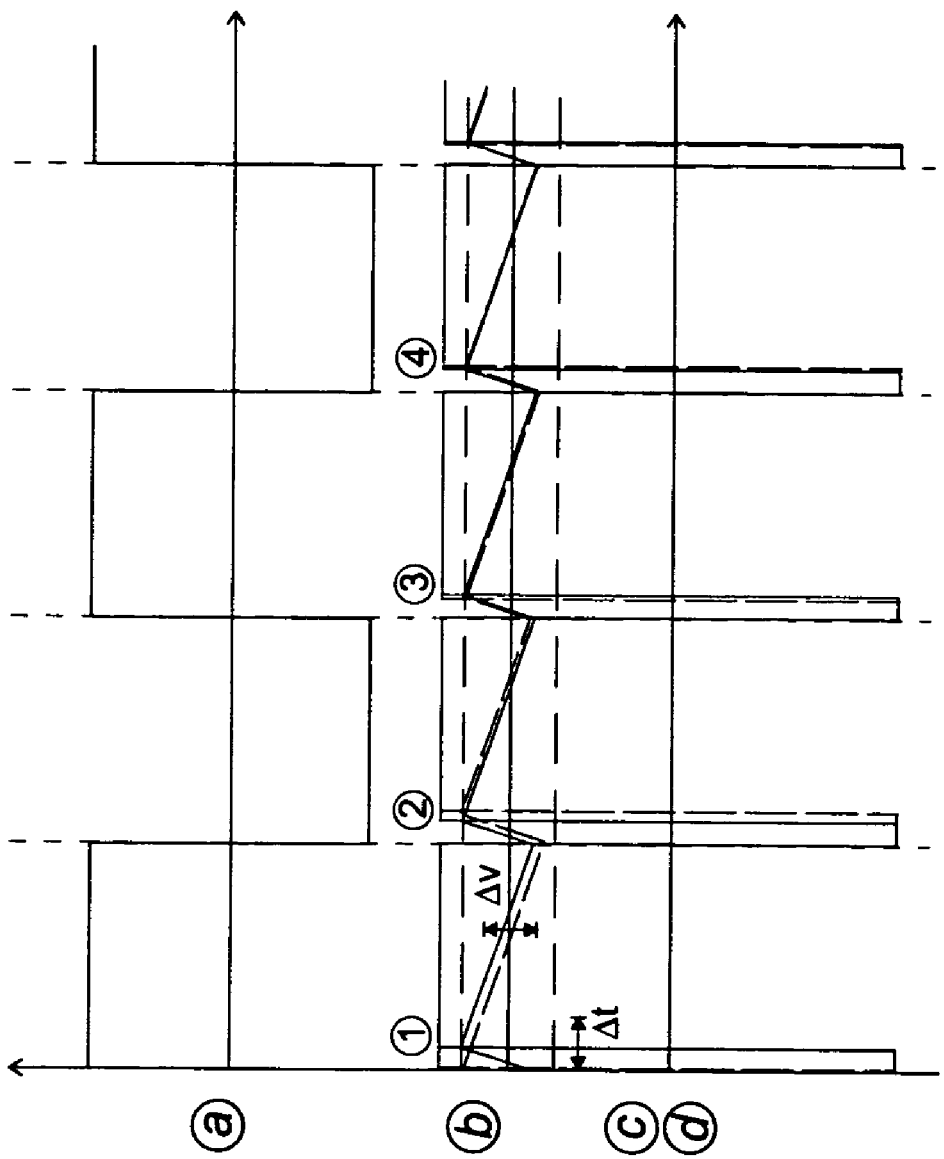

The phase locking property of the self-oscillating SICAM can be shown to be asymptotically stable as shown in FIG. 12. When a disturbance voltage □v is added to the carrier voltage, thereby causing a corresponding timing error □t at the first switching of the output stage, then the following expression for the subsequent errors are valid:

$$\Delta t_1 = \Delta t$$
$$\Delta t_2 = \left(\frac{1-M}{1+M}\right)\Delta t$$
$$\Delta t_3 = \left(\frac{1-M}{1+M}\right)^2 \Delta t$$
$$\dots$$
$$\Delta t_{n+1} = \left(\frac{1-M}{1+M}\right)^n \Delta t$$
$$\Delta v_1 = \Delta v$$
$$\Delta v_2 = \left(\frac{1-M}{1+M}\right)\Delta v$$
$$\Delta v_3 = \left(\frac{1-M}{1+M}\right)^2 \Delta v$$
$$\dots$$
$$\Delta v_{n+1} = \left(\frac{1-M}{1+M}\right)^n \Delta v$$

Due to the fact that the ratio between (1−M) and (1+M) is lower than 1, the asymptotic stability of the timing interval $t_+$ for the phase-shifted pulse width modulator is proven:

$$\Delta t_{n+1} = \left(\frac{1-M}{1+M}\right)^n \Delta t \xrightarrow{n\to\infty} 0$$
$$\Delta v_{n+1} = \left(\frac{1-M}{1+M}\right)^n \Delta v \xrightarrow{n\to\infty} 0.$$

With the maximum modulation index $M_{max}=1$, the time interval $t_+$ of the phase-shifted pulse width modulation approaches the period $T_{br}$ of the bridge and 0 with positive and negative voltages, respectively, which means that at one instant close to the maximum modulation, the switching of the input and the output stage will start to overlap and the resultant bridge voltage will have a switching frequency equal to the frequency of the HF-link voltage, $f_{br}=f_{s1}=f_{s2}$.

It is interesting to notice that, if the self-oscillating modulator is designed to have a basic idling switching frequency lower than two times the HF-link frequency, $M_{lim}$ becomes 0, and the self-oscillating modulator will then be in the locked operation mode all the time. Moreover, if the maximum of the modulation index M is kept below 1, operation in the locked mode guarantees non-simultaneous switching of the input and the output stage of the HF-link converter, which allows for complete removal of the clamp for the load current commutation and replacing it with some safe commutation switching strategy of the output stage based on the known polarity of the HF-link voltage. The main advantage is that these safe-commutation switching strategies do not necessitate any additional power component, but only require slight changes to the control and driving circuitry.

Figure 7:
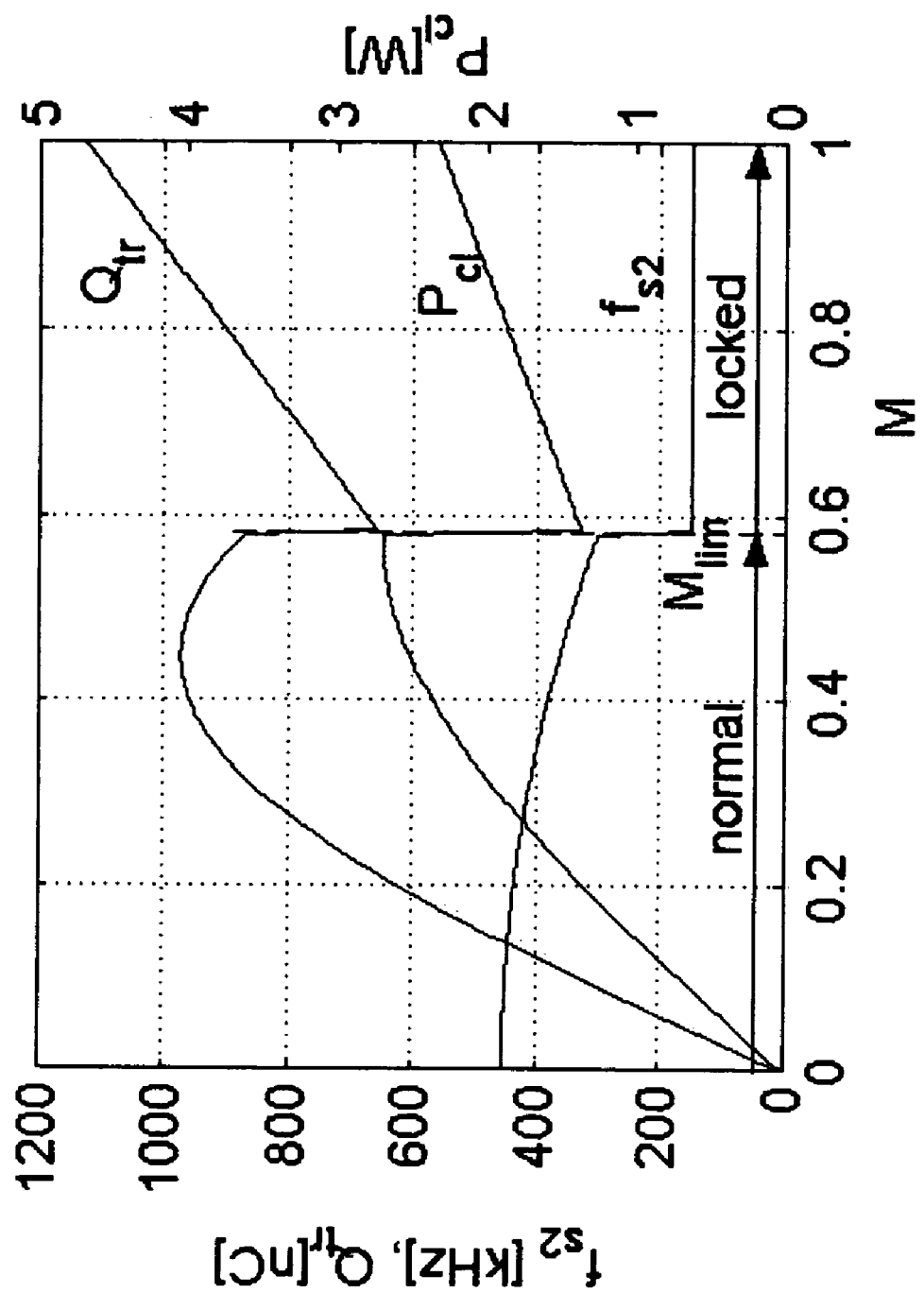

To summarise, the switching frequency $f_{s2}$ of the output stage in the self-oscillating SICAM differs when operating in normal or locked mode and can be described with the following equation:

$$f_{s2} = \begin{cases} \frac{1}{4}\frac{1-M^2}{\tau_{int}k_h k_a + t_d}, & M < M_{lim} \\ f_{s1}, & M \geq M_{lim} \end{cases}$$

and represents a discontinuous function as shown in FIG. 7.

The output stage switching frequency $f_{s2}$, the transferred charge $Q_{tr}$ to the clamp and the clamp power $P_{cl}$ as a function of the modulation index M with an idling output stage switching frequency of 450 kHz and an HF-link frequency of 150 kHz are depicted in FIG. 7. The graphs clearly show the transition from normal operation mode to locked operation mode.

Figure 8:
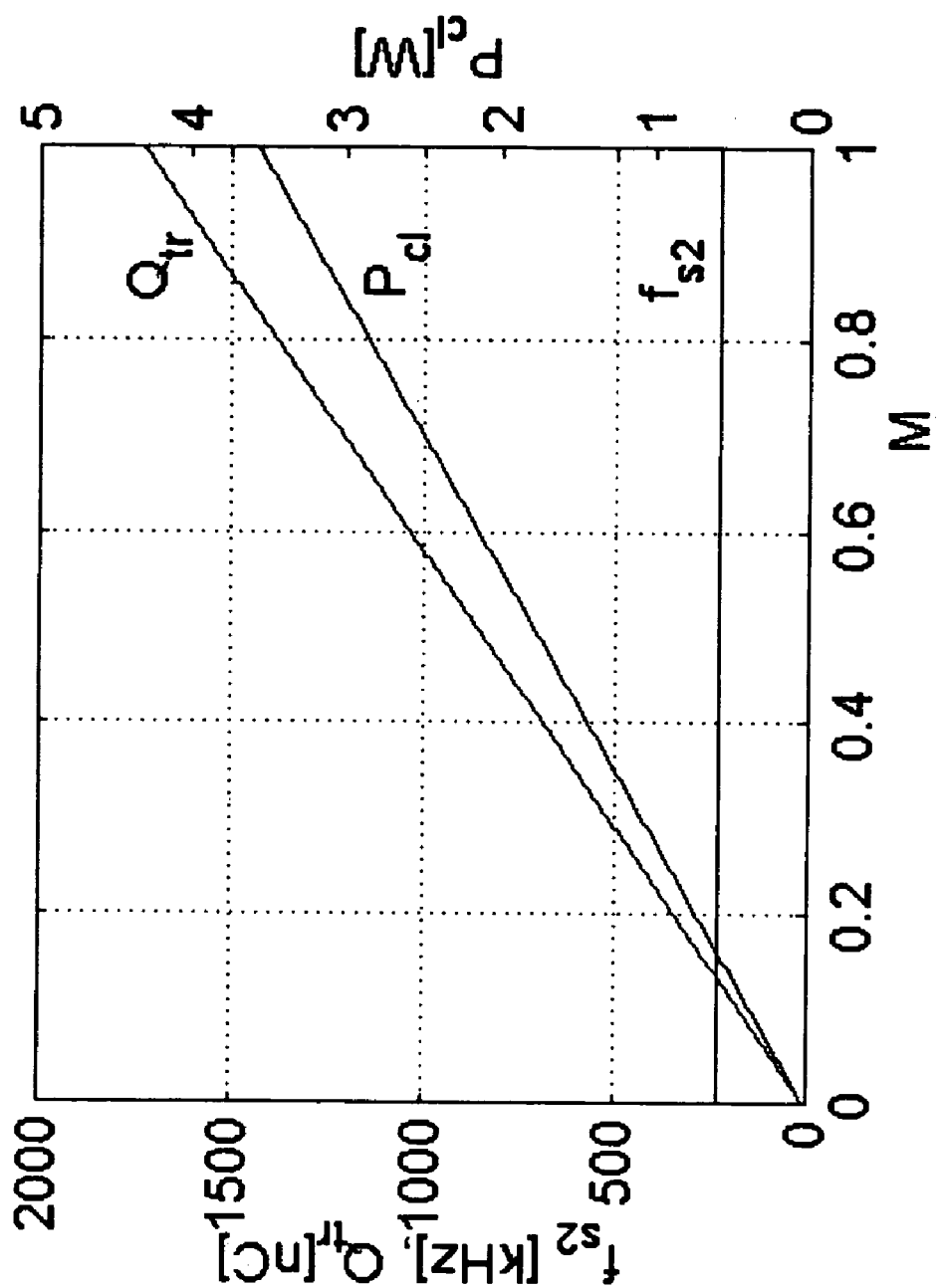
Figure 9:
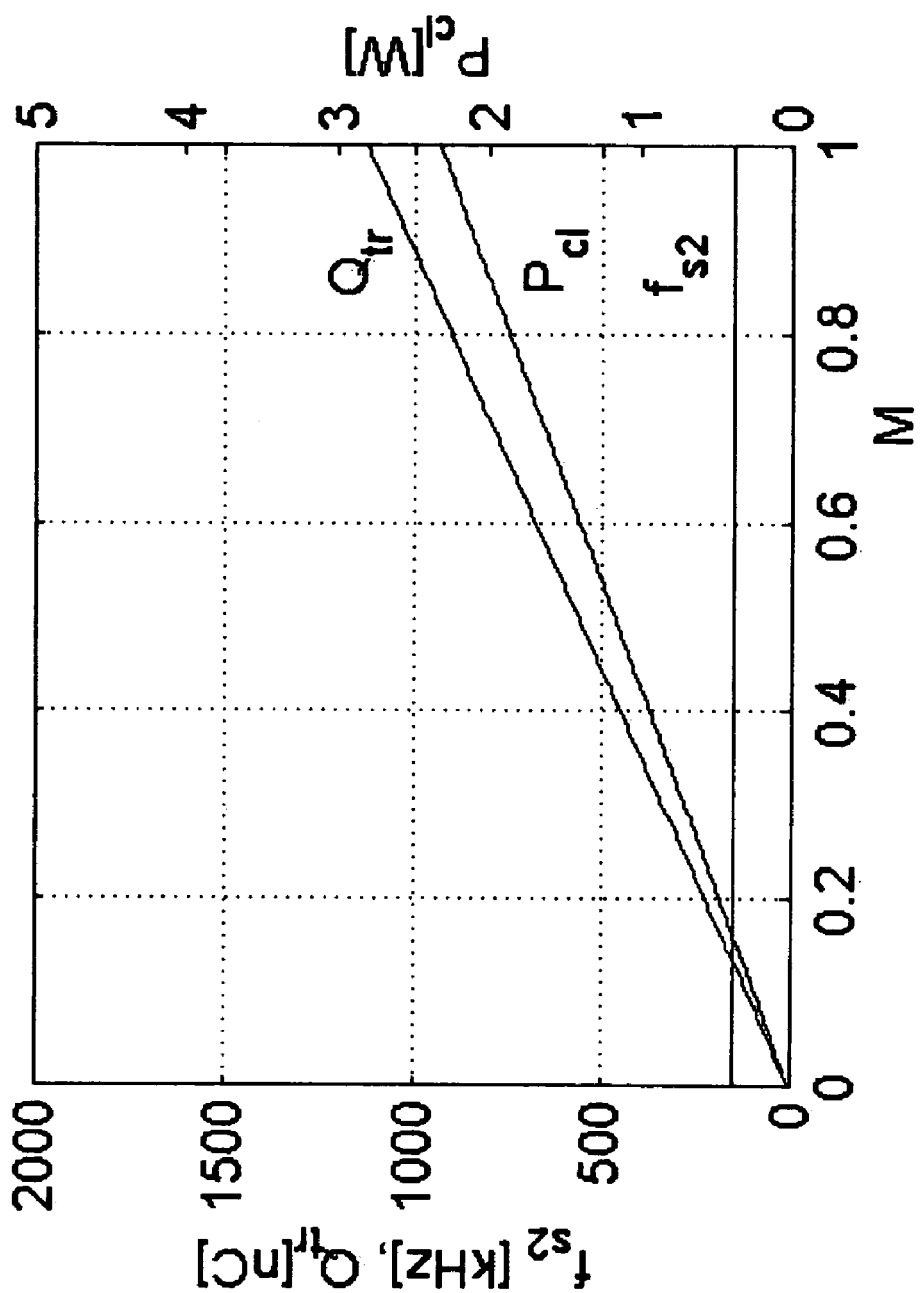

FIGS. 8 and 9 shows the output stage switching frequency $f_{s2}$ the transferred charge $Q_{tr}$ to the clamp and the clamp power $P_{cl}$ as a function of the modulation index M. FIG. 8 is shown for an idling output stage switching frequency of 450 kHz and an HF-link frequency of 230 kHz, while FIG. 9 is shown for an idling output stage switching frequency of 295 kHz and an HF-link frequency of 150 kHz. That is the modulator is always in the locked operation mode.

The above description of the invention reveals that it is obvious that it can be varied in many ways. Such variations are not to be considered a deviation from the scope of the invention, and all modifications which are obvious to persons skilled in the art are also to be considered comprised by the scope of the succeeding claims.

The invention claimed is:

1. A self-oscillating modulator operating at a two-level output, said modulator comprising:
   an alternating output stage;
   an optional output filter;
   a feedback including a function block with a transfer function (MFB);
   a forward block having a transfer function (MFW) and being provided with a system for calculating a difference between the signal originating from said function block and a reference signal, wherein an output voltage of the modulator from at least one of the alternating output stage and the output filter is fed back through the function block; and
   a multiplication element provided together with the forward block before the alternating output stage.

2. A self-oscillating modulator according to claim 1, further comprising an AC-link converter, wherein the alternating output stage is supplied with an AC-voltage from the AC-link converter.

3. A self-oscillating modulator according to claim 2, wherein the AC-link converter is an HF-link converter.

4. A self-oscillating modulator according to claim 1, wherein the forward block comprises a comparator.

5. A self-oscillating modulator according to claim 1, wherein the forward block comprises a hysteresis block, such as a Schmitt trigger.

6. A self-oscillating modulator according to claim 2, wherein the system for comparing the signal fed back with the reference signal comprises two identical comparator sections, which have inverted inputs.

7. A self-oscillating modulator according to claim 6, wherein the multiplication element works by switching between the two identical comparator sections with inverted inputs, said switching being controlled by a sign of the AC-voltage from the AC-link converter.

8. A self-oscillating modulator according to claim 1, wherein the transfer function of the forward block, the transfer function of the function block of the feedback, as well as a transfer function of the optional output filter depend on a desired open-loop transfer function.

9. A self-oscillating modulator according to claim 2 wherein the AC-voltage supplied to the alternating output stage has a rectangular form with a 50% duty cycle.

10. A self-oscillating modulator according to claim 1, wherein the alternating output stage comprises a switching amplifier with bidirectional switches.

11. A self-oscillating modulator according to claim 2 wherein the AC-link converter comprises an input stage and an output stage and wherein the AC-link converter can be driven either in a normal operation mode with a variable switching frequency of the output stage or a locked operation mode, where the switching frequency of the output stage is locked to a switching frequency of the input stage.

12. A self-oscillating modulator according to claim 11 wherein the normal operation mode will occur if a modulation index of a reference voltage signal at the input of the modulator is lower than a modulation index limit, and locked operation mode will occur if the modulation index exceeds the modulation index limit.

13. A self-oscillating according to claim 3, wherein an idling switching frequency of the modulator is lower than two times an HF-link frequency of said HF-link converter.

14. A self-oscillating modulator according to claim 1, wherein one or more zero points or poles of the function block and of the forward block coincide or approximately coincide with a pole or zero points of the optional output filter.

15. A self-oscillating modulator according to claim 1, further comprising one or more additional output filters, one or more additional feedbacks with transfer functions (CFB) coupled either after the output stage, after the output filter or after one or more of the additional output filters, as well as one or more forward blocks, which include both a system for calculating a difference between one of the signals fed back from the additional function blocks and a reference signal, as well as a transfer function (CFW).

16. A self-oscillating modulator according to claim 15, wherein the transfer function (MFB) of the function block, the transfer function (MFW) of the forward block, the additional output filters, the transfer functions (CFB) of the additional function blocks and the transfer function (CFW) of the additional forward blocks together generating the desired total transfer function.

17. A self-oscillating modulator according to claim 1, wherein a desired total transfer function is similar to a first order low-pass-characteristic or integrator characteristic.

* * * * *